(12) United States Patent
Machida et al.

(10) Patent No.: US 6,700,375 B2
(45) Date of Patent: Mar. 2, 2004

(54) MRI METHOD AND APPARATUS USING INDEPENDENT GRADIENT MAGNETIC FIELD SPOLIER PULSES

(75) Inventors: Yoshio Machida, Nasu-gun (JP); Satoshi Sugiura, Otawara (JP); Yoshimori Kassai, Nasu-gun (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/734,897

(22) Filed: Dec. 13, 2000

(65) Prior Publication Data

US 2001/0006345 A1 Jul. 5, 2001

(30) Foreign Application Priority Data

Dec. 13, 1999 (JP) .......................................... 11-353168

(51) Int. Cl.[7] .................................................. G01V 3/00
(52) U.S. Cl. ...................................... 324/314; 324/309
(58) Field of Search .................................. 324/318, 309, 324/314, 307, 320

(56) References Cited

U.S. PATENT DOCUMENTS

| | | | | |
|---|---|---|---|---|
| 4,795,978 A | * | 1/1989 | Zur et al. ..................... | 324/309 |
| 4,855,679 A | * | 8/1989 | Granot ......................... | 324/309 |
| 5,122,747 A | * | 6/1992 | Rieder et al. ................ | 324/309 |
| 5,124,650 A | * | 6/1992 | Granot ......................... | 324/309 |
| 5,225,779 A | * | 7/1993 | Parker et al. ................ | 324/306 |
| 5,270,654 A | * | 12/1993 | Feinberg et al. ............ | 324/309 |
| 5,726,569 A | * | 3/1998 | Krieg et al. ................. | 324/309 |
| 6,008,647 A | * | 12/1999 | Zhou et al. .................. | 324/309 |
| 6,011,392 A | * | 1/2000 | Zhou et al. .................. | 324/309 |
| 6,181,134 B1 | * | 1/2001 | Wald .......................... | 324/307 |
| 6,259,940 B1 | * | 7/2001 | Bernstein et al. ........... | 324/309 |
| 6,275,036 B1 | * | 8/2001 | van Yperen et al. ........ | 324/306 |
| 6,329,821 B1 | * | 12/2001 | Zhou .......................... | 324/318 |

OTHER PUBLICATIONS

Hinks R. S. et al.: "Gradient Moment Nulling in Fast Spin Echo" MRM, 32: pp. 698–706, 1994.
Kassai Y. et al.: "3D Half–Fourier Fast SE for Heavy T2–Weighted Imaging" in "Proceedings, ISMRM, 4th annual meeting", p. 736, 1996.
Kassai Y. et al.: "3D Half–Fourier RARE with MTC for Cardiac Imaging" in "Proceedings, ISMRM, 6th annual meeting", p. 806, 1998.
Henning J.: "Multiecho Imaging Sequences with Low Refocusing Flip Angles" JMR, 76: pp. 397–407, 1988.
Semelka R. C. et al."HASTE MR Imaging: Description of Technique and Preliminary Results in the Abdomen" JMRI, 6: pp. 698–699, 1996.

* cited by examiner

Primary Examiner—Diego Gutierrez
Assistant Examiner—Dixomara Vargas
(74) Attorney, Agent, or Firm—Nixon & Vanderhye P.C.

(57) ABSTRACT

In fast imaging of a multi-echo method represented by a fast spin echo (FSE) method, a pulse sequence is arranged such that a basic condition relating to a CPMG method is satisfied and a spoiler gradient magnetic field pulse is independently applied immediately after a flop pulse. The spoiler gradient magnetic field pulse for suppressing an undesired signal is applied by a predetermined amount or more so as to prevent superimposition of other gradient magnetic field components such as a phase encoding component, a rewind component, etc., and to prevent a residual component of an FID signal caused by a certain RF pulse from being refocused by a subsequent RF pulse.

18 Claims, 9 Drawing Sheets

MRI METHOD AND APPARATUS USING INDEPENDENT GRADIENT MAGNETIC FIELD SPOLIER PULSES

CROSS-REFERENCE TO RELATED APPLICATIONS

This application is based upon and claims the benefit of priority from the prior Japanese Patent Application No. 11-353168, filed Dec. 13, 1999, the entire contents of which are incorporated herein by reference.

BACKGROUND OF THE INVENTION

The present invention relates generally to a magnetic resonance imaging apparatus, and more particularly to a magnetic resonance imaging apparatus for performing 3D imaging using a fast spin echo method.

In modern magnetic resonance imaging apparatuses, an imaging method, which adopts a pulse sequence of a multi-echo method for acquiring multi-echo data with repeated refocusing effected by application of RF pulses, is widely used as an ordinary imaging method for cross-sectional imaging of a subject. In the following description, this imaging method is representatively referred to as a fast spin echo method (FSE method). The fast spin echo method is described in Hennig J, Multiecho imaging sequences with a low flip angles, MJRI, 78:397–407, 1988, and Keifer B, et al., Image acquisition in a second with half Fourier acquisition single shot turbo spin echo, JMRI 1994; 4(P):86.

As is described in Y. Kassai, et al., 3D half-Fourier fast SE for heavy T2-weighted imaging, in "Proceedings, ISMRM, 4th Annual Meeting", p. 736, 1996 and Y. Kassai, "Fast ASE and Clinical Application thereof", Medical Review No. 69, pp. 28–34, 1998, there is a tendency that 3D imaging using the fast spin echo method is generally applied to medical imaging diagnosis. This technique is called FASE (Fast Asymmetric Spin Echo) technique.

In a modern technical trend in connection with this, it has become possible to decrease an echo train spacing (ETS) which affects an imaging time, and accordingly attention has been paid to imaging of movable objects such as an internal organ (parenchyma) or blood flows, as described in R C Selmeka, et al., HASTE imaging: Description of technique and preliminary results in the abdomen, JMRI, 6:698–699, 1996, and Y. Kassai, et al., 3D Half-Fourier RARE with MTC for Cardiac Imaging, In "Processings, ISMRM, 6th Annual Meeting", P. 806, 1998.

However, where the echo train spacing (ETS) is to be decreased for 3D imaging using the FSE method, there arises a problem of artifact on an acquired image due to unnecessary FID signals resulting from refocusing flop pulses.

BRIEF SUMMARY OF THE INVENTION

The present invention aims at enhancing an image quality in fast 3D imaging, and the object thereof is to provide a magnetic resonance imaging apparatus capable of effectively spoiling unnecessary signals occurring when image signals are acquired.

In order to achieve the above object, according to an aspect of the invention, there is provided a magnetic resonance imaging apparatus comprising: an RF pulse application unit for applying an RF pulse to an imaging region; a gradient magnetic field application unit for applying a gradient magnetic field to the imaging region; and a control unit for controlling the RF pulse application unit and the gradient magnetic field application unit according to a pulse sequence, the pulse sequence (a) applying an excitation RF pulse and a selection gradient magnetic field for selecting and exciting a spin within a desired region in a subject, (b) applying refocusing RF pulses for generating a plurality of echo signals by successively refocusing the excited spin several times, (c) applying a first phase encoding gradient magnetic field for providing a phase encoding of a different value to each of the plurality of echo signals, and (d) repeating the steps (a) to (c) while applying a second phase encoding gradient magnetic field with a varying value in a predetermined direction different from a direction of the first phase encoding gradient magnetic field, and the pulse sequence applying the second phase encoding gradient magnetic field immediately before each of the refocusing RF pulses, and applying a spoiler gradient magnetic field of a predetermined amount in the predetermined direction between each of the refocusing RF pulses and each of the echo signals, and all the gradient magnetic fields applied in the predetermined direction satisfying a phase condition of a CPMG method.

According to another aspect of the invention, there is provided a magnetic resonance imaging apparatus comprising: RF pulse application means for successively applying a plurality of exciting or refocusing RF pulses to an imaging region; and gradient magnetic field application means for applying a plurality of gradient magnetic fields such that all gradient magnetic fields applied in a predetermined direction satisfy a phase condition of a CPMG method and an application amount either immediately after the RF pulse application means has applied the refocusing RF pulses or immediately after a magnetic resonance signal has been read out becomes a predetermined amount or more.

According to still another aspect of the invention, there is provided a magnetic resonance imaging apparatus for acquiring a 3D magnetic resonance image by executing a pulse sequence of a fast spin echo method, wherein two-dimensional image data in first and second directions is acquired within one to several shots, two-dimensional image data in a third direction is acquired by repetition of shots, and the magnetic resonance image is produced by a half-Fourier transform in a direction of shots.

According to still another aspect of the invention, there is provided a magnetic resonance imaging apparatus for acquiring a 3D magnetic resonance image by executing a pulse sequence of a fast spin echo method, the apparatus comprising: RF pulse application means for applying an RF pulse to an imaging region; gradient magnetic field pulse application means for applying a gradient magnetic field pulse of a predetermined amount or more for suppressing an undesired signal occurring due to the RF pulse applied by the RF pulse application means, while performing phase encoding for 3D imaging; acquisition means for acquiring two-dimensional image data in first and second directions within one to several shots and two-dimensional image data in a third direction by repetition of shots by controlling the RF pulse application means and the gradient magnetic field pulse application means, thus acquiring three-dimensional image data; and generation means for generating the magnetic resonance image by applying a half-Fourier transform in a direction of shots to the three-dimensional image data acquired by the acquisition means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will now be described with reference to the accompanying drawings.

First Embodiment

A magnetic resonance imaging apparatus comprises a static magnetic field magnet for applying a uniform static field to an imaging region where a subject is inserted; an RF coil for applying RF pulses to the imaging region; a gradient magnetic field coil for applying a gradient magnetic field to the imaging region; and a sequencer for controlling the driving of the RF coil and gradient magnetic field coil according to pulse sequences. A publicly known hardware structure is applied to the magnetic resonance imaging apparatus.

Figure 1:
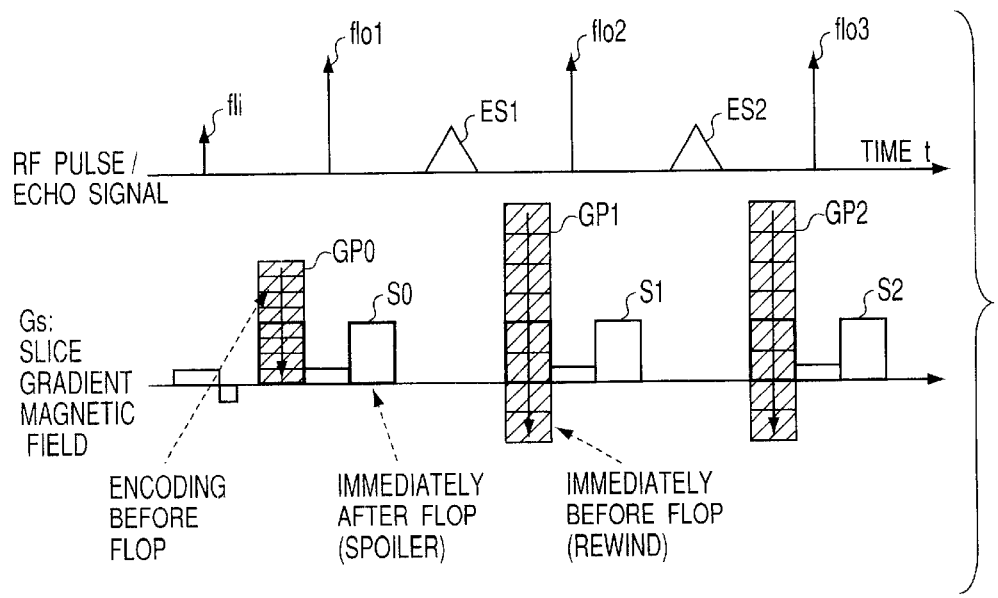
FIG. 1 shows an example of a pulse sequence provided in a magnetic resonance imaging apparatus according to a first embodiment of the present invention.

FIG. 1 shows an example of a pulse sequence provided in a magnetic resonance imaging apparatus according to a first embodiment of the present invention. This sequence is a basic fast spin echo (FSE) pulse sequence suitable for 3D imaging. Symbol fli denotes an excitation (90°) pulse, and flo1, flo2, flo3, . . . denote refocus (180°) pulses. Symbols ES1, ES2, . . . denote detected echo signals. In the following description, the excitation pulse fli is referred to as "flip pulse fli", and the refocus pulses flo1, flo2, . . . as "flop pulses flo1, flo2, . . . "

Symbol GP0 denotes a gradient magnetic field pulse applied in a flip-flop duration, that is, between the flip pulse fli and the flop pulse flo1. Symbols GP1, GP2, . . . denote gradient magnetic field pulses applied immediately before flop, i.e. immediately before the flop pulses flo2, flo3, . . . Symbols S0, S1, . . . denote spoiler pulses applied immediately after flop, i.e. immediately after the flop pulses flo1, flo2, . . .

FIG. 1 shows the gradient magnetic field pulses only with respect to components applied in the slice direction. These gradient magnetic field pulses are applied, where necessary, as gradient magnetic field pulses for:

(1) selective excitation,
(2) spoiling, and
(3) phase encoding in a slice direction relating to 3D imaging.

In the pulse sequence of the present embodiment, the gradient magnetic field pulses (1) to (3) are applied to meet the basic condition for gradient magnetic field application. In addition, immediately after the application of the flop pulse, the spoiling gradient field pulse (2) is applied independently.

As is understood from FIG. 1, other gradient magnetic field components for phase encoding or rewind are not superimposed on the spoiler pulses S0, S1, S2, . . . , and an application amount of each spoiler pulse is a predetermined level or more.

The basic condition in this context is a condition of area of gradient field in the fast spin echo pulse sequence. This condition indicates the relation of the application amount of gradient magnetic field pulses relative to the flip pulse and flop pulse.

More specifically, if the gradient field application amount in the flip pulse to flop pulse duration is A and the gradient field application amount in the subsequent flop pulse to flop pulse duration is A' (constant), the condition is A:A': . . . =1:2: . . . .

The application amount of gradient magnetic field corresponds to the area of the gradient magnetic field pulse illustrated in the pulse sequence, and the physical unit thereof is [(mT/m)·s].

This basic condition is a sufficient condition for setting in phase the signal components of many paths on a phase diagram in the FSE imaging using a CPMG (Carr Purcell Meiboom Gill) method (phase condition).

For comparison with the embodiment of the present invention, a prior-art pulse sequence will now be described.

Figure 2:
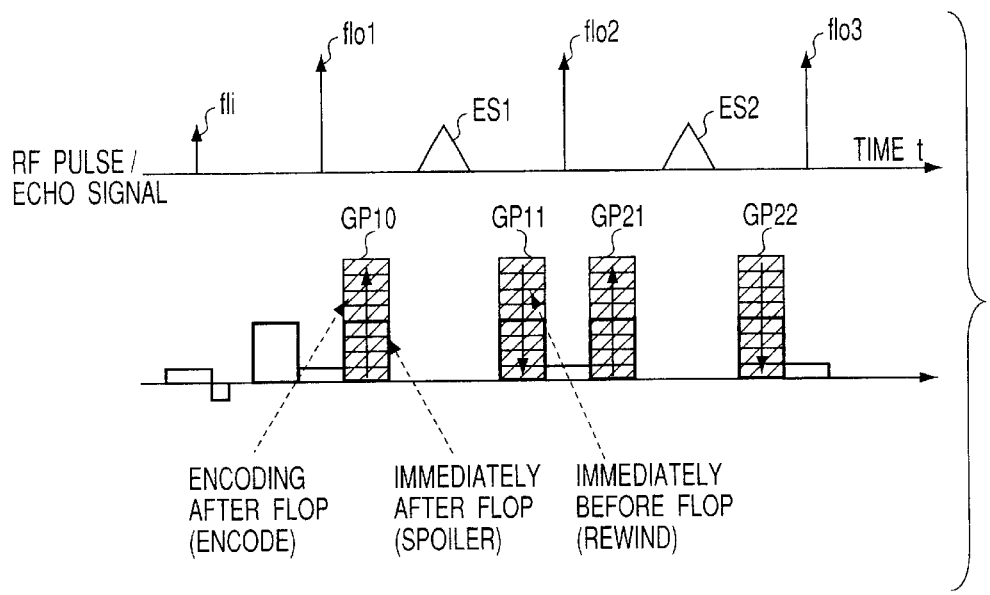
FIG. 2 shows prior art of an FSE pulse sequence suitable for 3D imaging.

FIG. 2 shows an example of a prior-art FSE pulse sequence suitable for 3D imaging. The RF pulses and echo signals are the same as those shown in FIG. 1.

In FIG. 2, gradient magnetic field pulses GP10 and GP11 are gradient magnetic field pulses applied in a duration between flop pulses flo1 and flo2. The gradient magnetic field pulse GP10 is applied immediately after the flop pulse flo1 and before the echo signal ES1.

The gradient magnetic field pulse GP11 is applied after the echo signal ES1 and immediately before the flop pulse flo2. Gradient magnetic field pulses GP21 and GP22 are the same as the gradient magnetic field pulses GP10 and GP11.

The application amount in the duration between the flop pulses flo1 and flo2 is equal that in the duration between the flop pulses flo2 and flo3.

In this prior-art pulse sequence, the basic waveform including the above-mentioned spoiler components is provided so as to meet the above-mentioned basic condition. In this prior art, the slice-directional phase encoding gradient magnetic field pulse for 3D imaging is applied for every echo, and rewind is effected before the next RF pulse is received. Thereby, the application amount between the RF pulses is reduced to substantially zero.

The gradient magnetic field pulse GP10 applied immediately after the flop includes both the slice-directional phase encoding component and spoiler component. The gradient magnetic field pulse GP11 applied immediately before the flop includes the rewind component relating to the phase encoding.

It is necessary that the above-mentioned basic condition be satisfied with very high precision. In the prior art, in general, the basic waveforms excluding additional phase encoding components (i.e. slice-directional phase encoding components relating to 3D imaging) are made to satisfy the basic condition, and rewinds are applied separately for the additional phase encoding components, whereby the area A between the flip and flop and the area A' between the flop RF pulses are reduced to zero.

This prior art has the following problem.

In a certain phase encoding, the intensity of the sum of the spoiler gradient magnetic field (corresponding to the above-mentioned component (2)) and the slice-directional phase encoding gradient magnetic field (corresponding to the above-mentioned component (3)) decreases, and as a result the spoiling effect becomes deficient.

Consequently, artifact occurs on a magnetic resonance image due to an FID signal component caused by the flop pulse. In this case, the undesired FID signal component, like the desired signal component, is subjected to phase encoding, and a problem arises in a specific encoding. In general, an artifact of a high-frequency component superimposed on the image will occur.

On the other hand, in the first embodiment of the present invention, a spoiler pulse of a predetermined amount or more is applied while the aforementioned basic condition is satisfied. More specifically, the gradient magnetic field pulses such as the spoiler pulse are applied according to a condition explained below.

Phase encoding number $k: k=-N/2, \ldots, N/2-1$
Amount of k-th phase encoding: $E(k)=(k/N)*Gmax$
Application amount in flip-flop duration: $A0(k)$
Application amount immediately after flop: $A1(k)$
Application amount immediately before flop: $A2(k)$ In this case, the following equations (1) and (2) are established:

$$A1(k)-A0(k)=E(k) \tag{1}$$

$$A1(k)+A2(k)=2\times A0(k) \tag{2}$$

In other words, in every phase encoding, the amount obtained by subtracting the application amount in the flip-flop duration from the application amount immediately after the flop is equal to the phase encoding amount, and the amount obtained by adding the application amount immediately before the flop to the application amount immediately after the flop is equal to double the application amount in the flip-flop duration.

In the prior art, there is a shot (a series of pulse sequence execution operations relating to imaging) wherein the spoiling effect is lost or decreased. By contrast, in the present invention, the spoiling effect is always maintained in each of shots in which phase encoding amounts are different.

Accordingly, where the ETS is to be shortened for 3D image, an unnecessary signal such as FID signal due to a refocus pulse can be suppressed. Therefore, an artifact on an acquired image can be eliminated or suppressed.

There are various modifications of the method of the present invention. A typical example of the method is referred to as a constant flop spoiler (CFS) method. In FIG. 1, it is assumed that the application amount of the spoiler gradient magnetic field is equal to the maximum phase encoding amount. An example of a more "ideal" spoiler amount will be described later as Modification 2.

Modification 1

Modification 1 of the first embodiment will now be described.

In Modification 1, gradient magnetic field pulses are applied with the positive/negative being changed.

As is understood from comparison between FIGS. 1 and 2, the application amounts of gradient magnetic fields in the pulse sequence of the present invention are greater than in the prior art. This means that a greater load acts on the magnetic resonance imaging apparatus. Depending on the imaging conditions or the absolute performance of the apparatus, it is possible that the pulse sequence cannot be realized.

In Modification 1, two sequences with different polarities (positive/negative) of spoilers are provided. These sequences are combined to acquire all data. While the sequences are being executed, the positive/negative of the spoiler is switched according to the slice-directional phase encoding (rewind) amount.

Figure 3:
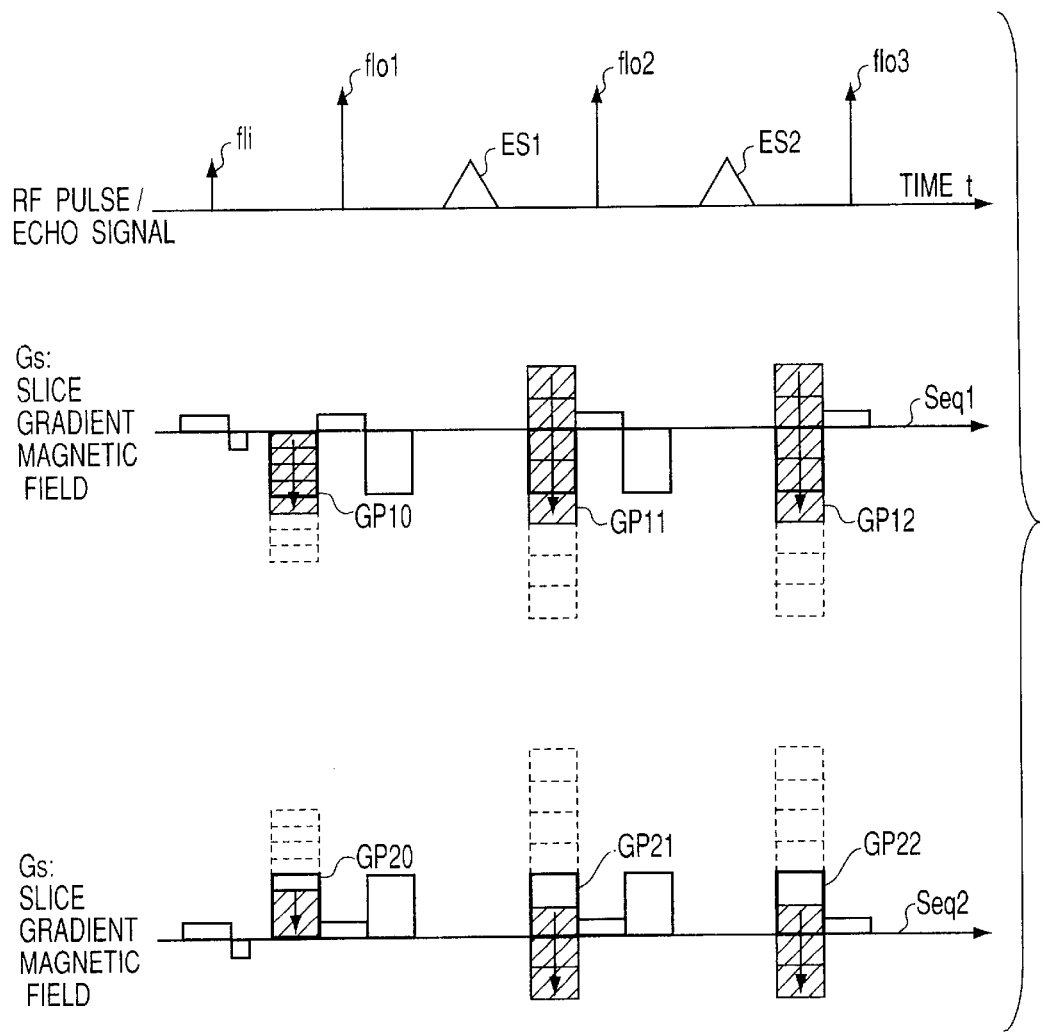
FIG. 3 shows an example of a pulse sequence according to Modification 1 of the first embodiment.

FIG. 3 shows an example of the pulse sequences of Modification 1. In FIG. 3, Seq1 denotes a sequence for applying negative spoiler pulses, and Seq2 denotes a sequence for applying positive spoiler pulses.

The sequence Seq1 is executed to acquire echo data with respect to the former group of phase encoding number k (−128 to +32 in this example), and the sequence Seq2 is executed to acquire the other echo data with respect to the latter group of phase encoding number k (+32 to +128). In the former data acquisition (Seq1), for example, gradient magnetic field pulses GP10, GP11, GP12, . . . are applied immediately before the flop pulses flo1, flo2, flo3, . . . , and negative spoiler pulses of predetermined amounts or more are applied immediately after the flop pulses.

Subsequently, in the latter data acquisition (Seq2), gradient magnetic field pulses GP20, GP21, GP22, . . . are applied immediately before the flop pulses flo1, flo2, flo3, . . . , and positive spoiler pulses of predetermined amounts or more are applied immediately after the flop pulses.

It is desirable that the switching of sequences Seq1 and Seq2 (switching of positive/negative of spoiler pulses) be effected at a point other than the center of the k-space in order to prevent an effect of difference in positive/negative characteristics. In this example, the switching is effected at the phase encoding number k=32, and not at the phase encoding number k=0.

Figure 4A:
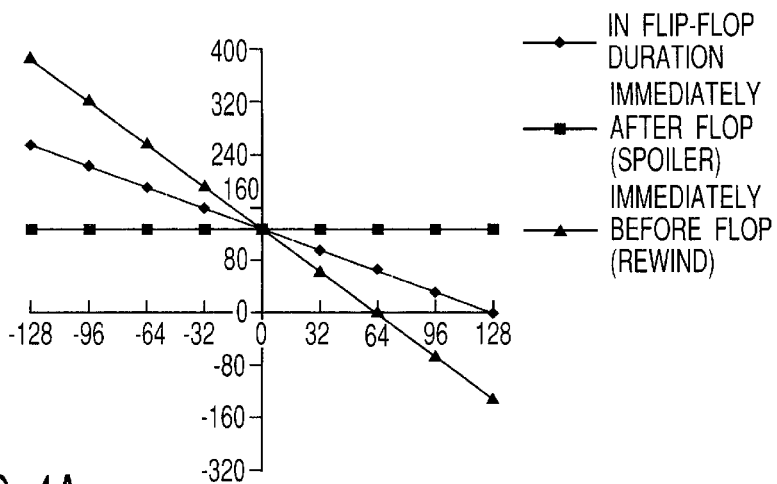
FIG. 4A is a graph showing application amounts of gradient magnetic fields in a flip-flop duration, immediately after the flop (spoiler) and immediately before the flop (rewind), FIG. 4A corresponding to the first embodiment.
Figure 4B:
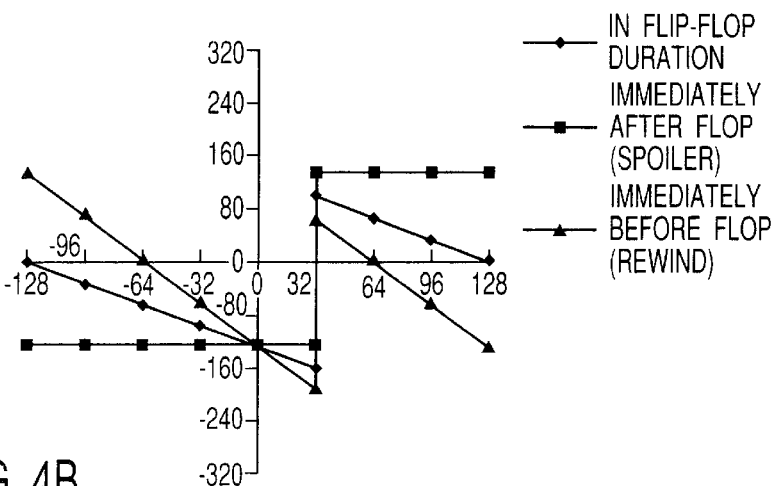
FIG. 4B is a graph showing application amounts of gradient magnetic fields in a flip-flop duration, immediately after the flop and immediately before the flop, FIG. 4B corresponding to Modification 1.
Figure 4C:
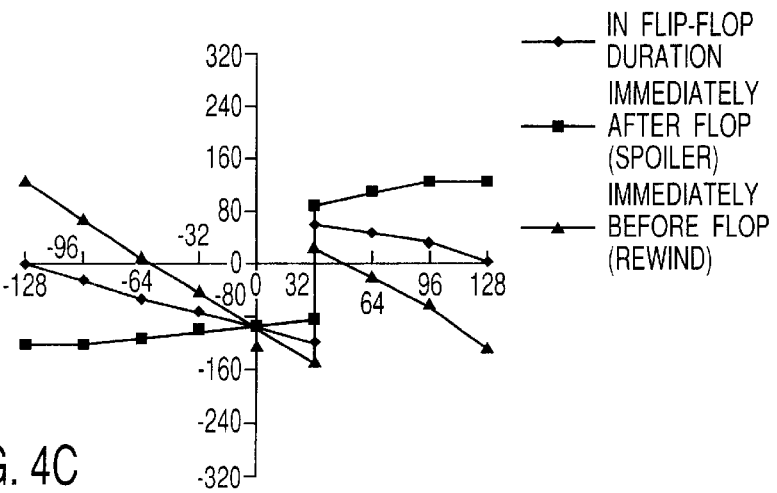
FIG. 4C is a graph showing application amounts of gradient magnetic fields in a flip-flop duration, immediately after the flop and immediately before the flop, FIG. 4C corresponding to Modification 2.

FIGS. 4A to 4C are graphs showing application amounts of gradient magnetic fields in a flip-flop duration, immediately after the flop (spoiler) and immediately before the flop (rewind). FIG. 4A shows a case of the pulse sequence shown in FIG. 1 according to the first embodiment, and FIG. 4B shows a case of the pulse sequence shown in FIG. 3 according to Modification 1. The abscissa of each graph indicates the slice-directional phase encoding number (amount), and the ordinate indicates the application amount of gradient magnetic field.

As is clear from FIG. 4A, in the case of the pulse sequence shown in FIG. 1, the application amount of the gradient magnetic field immediately after the flop (spoiler) takes a positive constant value. On the other hand, as is clear from FIG. 4B, in the case of the pulse sequence shown in FIG. 3 according to Modification 1, the application amount of the gradient magnetic field immediately after the flop (spoiler) changes its value from a negative one to a positive one at the encoding number 32. In addition, the maximum value of the application amount of the gradient magnetic field immediately before the flop (rewind) is lower than that in FIG. 4A.

As has been described above, according to Modification 1, a sufficient spoiling effect can be obtained like the first embodiment, and the maximum value of the applied gradient magnetic field can be reduced. Therefore, the technique of Modification 1 is applicable to various imaging conditions and absolute performances of apparatuses.

Modification 2

Modification 2 of the first embodiment will now be described.

In Modification 2, the gradient magnetic field pulses are applied with the positive/negative polarity being changed, and the application amount of gradient magnetic field is finely adjusted.

If the above equations (1) and (2) are met and the desired spoiling effect is obtained, there is no need to keep the spoiler amount constant in accordance with the encoding amount. In Modification 2, as shown in FIG. 4C, the application amount of gradient magnetic field is finely adjusted in accordance with a variation in encoding amount. Thereby, the optimal condition can be chosen in accordance with the performance of the apparatus, and the present invention can be applied more widely.

Modification 3

Modification 3 of the first embodiment will now be described.

Modification 3 relates to an increase in the application amount of gradient magnetic field.

In the prior art of the pulse sequence shown in FIG. 2, it is assumed that the application amount of spoiler is equal to the maximum phase encoding amount determined by the slice-directional spatial resolution. As regards the function of the spoiler, there is no problem if the spoiler can disperse the phase of spin within a voxel to some degree, thereby sufficiently suppressing an undesired signal. If double the amount of spoiler is applied, the phase of spin within the voxel is dispersed by one rotation, and the undesired signal will substantially disappear and the "ideal" state is realized.

The application amount of gradient magnetic field will be explained in detail.

Spatial resolution: dS[m]

Imaging region: LS[m]

Gradient magnetic field application time: T[s]

Acquisition matrix: NS=LS/ds

In this case, the phase encoding gradient magnetic field intensity (maximum amplitude Gmax) necessary for imaging is expressed by $\pm 1/(2\times(T*dS))$, and the "ideal" spoiler intensity (Gsp0) is expressed by $1/(T*dS)$.

The "ideal" spoiler amount is the amount by which the spin phase distribution in one voxel in the direction of application of spoiler is made to correspond to one rotation. In practical level use, there arises no problem if the undesired signal is sufficiently suppressed. It is not necessarily required to obtain this amount.

If ETS=5[ms], the gradient magnetic field application time is 1 [ms] and the spatial resolution is 2 [mm], then the phase encoding gradient magnetic field intensity necessary for imaging and the "ideal" spoiler intensity (Gsp0) can be estimated as follows:

$$Gmax=1/\{2\times(1\times10^{-3})\times(2\times10^{-3})\}=2,500[Hz/cm](=5.87[mT/m])$$

$$Gsp0=5,000[Hz/cm](=11.75[mT/m]).$$

Assuming that the spatial resolution =1 [mm], the following is given:

$$Gmax=5.000[Hz/cm](=11.75[mT/m])$$

$$Gsp0=10,000[Hz/cm](=23.50[mT/m]).$$

Figure 5A:
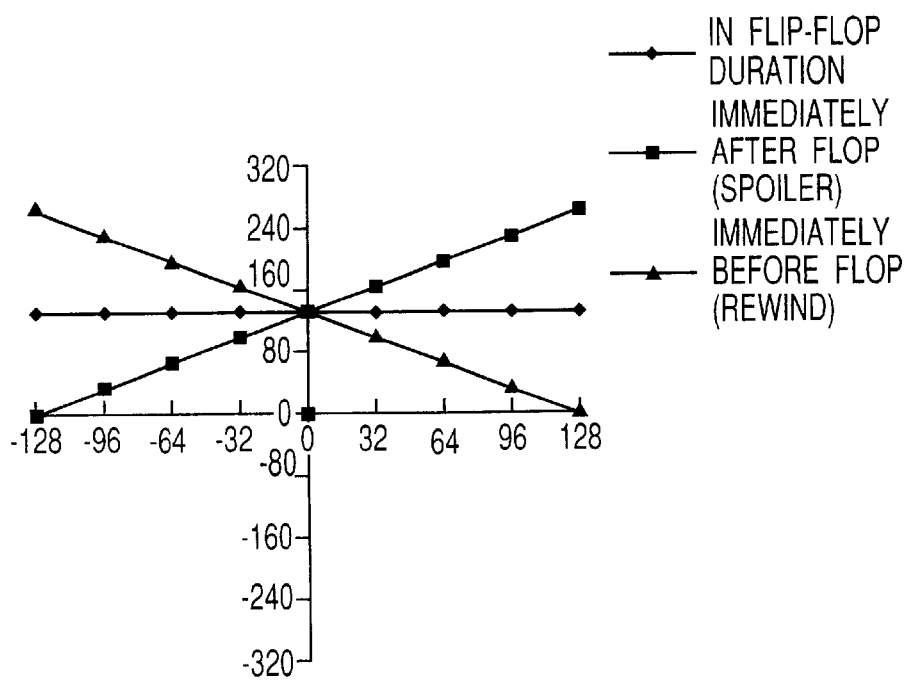
FIG. 5A is a graph showing application amounts of gradient magnetic fields in the prior art corresponding to the pulse sequence shown in FIG. 2, with a spoiling amount being set to be equal to a maximum phase encoding amount.
Figure 5B:
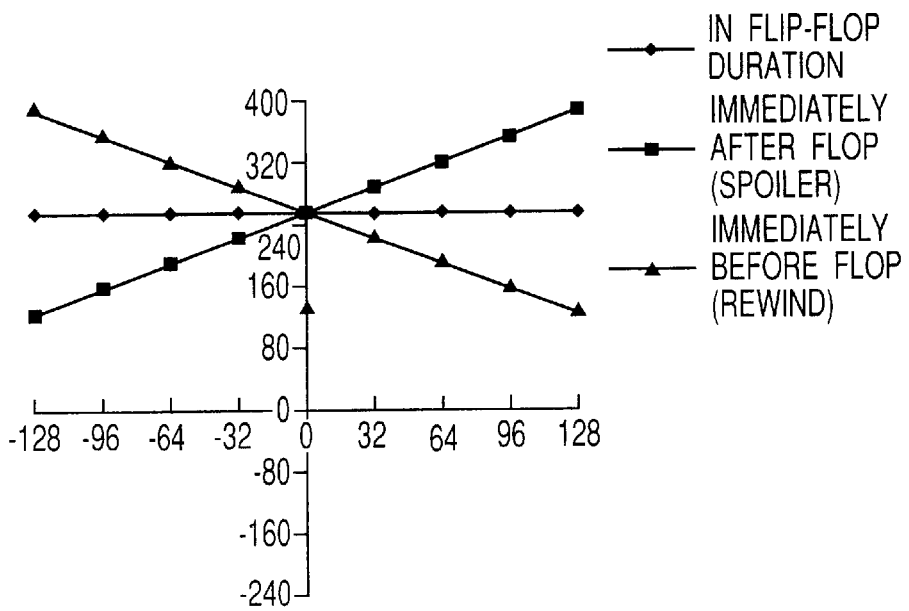
FIG. 5B is a graph showing application amounts of gradient magnetic fields in the prior art corresponding to the pulse sequence shown in FIG. 2, with a spoiling amount being increased to an "ideal" state.

A graph of FIG. 5A showing the application amount corresponds to the prior-art pulse sequence shown in FIG. 2. In FIG. 5A, the spoiler amount is equal to the maximum phase encoding amount determined by the slice-directional spatial resolution. A graph of FIG. 5B shows the case where the spoiler amount is increased to the "ideal" level according to the above technique.

Figure 6A:
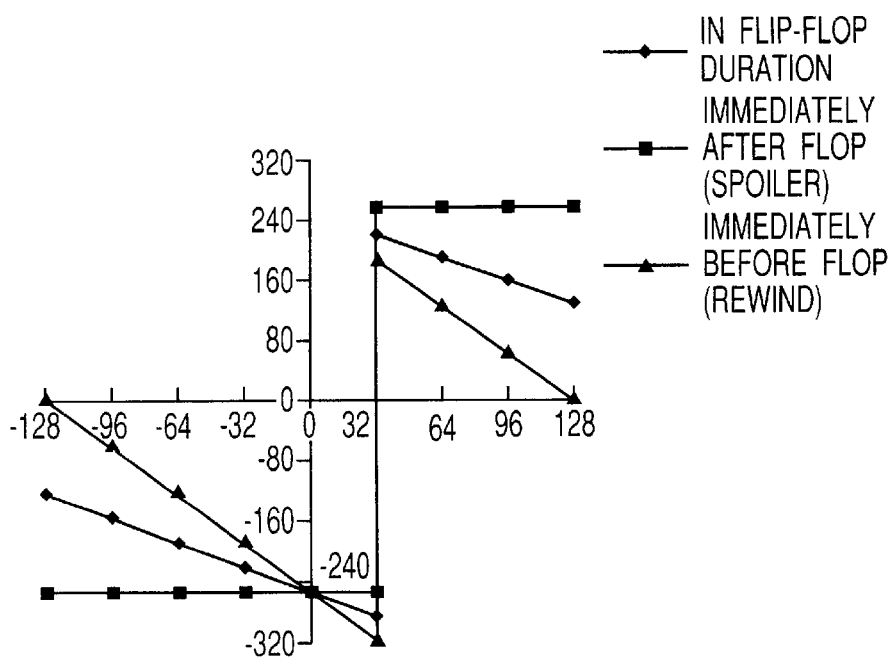
FIG. 6A is a graph showing application amounts of gradient magnetic fields in Modification 3 of the first embodiment wherein the spoiling amount has been increased, FIG. 6A corresponding to Modification 1.
Figure 6B:
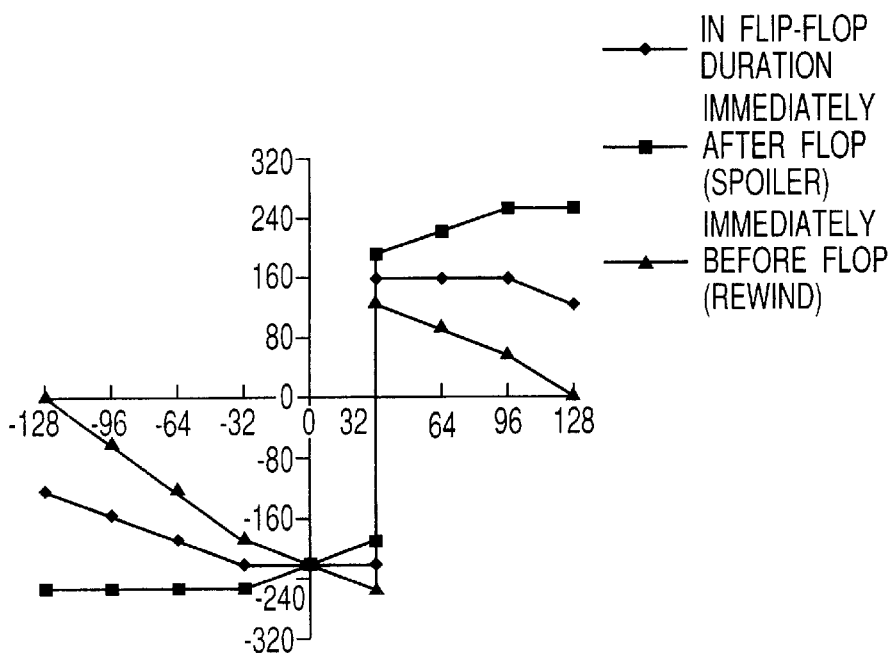
FIG. 6B is a graph showing application amounts of gradient magnetic fields in Modification 3 of the first embodiment wherein the spoiling amount has been increased, FIG. 6B corresponding to Modification 2.

FIGS. 6A and 6B are graphs showing the application amounts where the spoiler amount is increased according to Modification 3 of the first embodiment. FIG. 6A relates to Modification 1 of the first embodiment, wherein the spoiler amount in the pulse sequence shown in FIG. 3 is increased to the "ideal" level. FIG. 6B relates to Modification 2 of the first embodiment, wherein the spoiler amount is increased to the "ideal" level.

According to the above-described modifications, the positive/negative polarity is changed during encoding, thereby making various improvements, e.g. reduction in the spoiler intensity. If a half-Fourier method is additionally employed in the slice direction from the standpoint of 3D imaging, a more preferable embodiment can be obtained. This will now be described as a second embodiment of the present invention.

Second Embodiment

A second embodiment of the invention relates to a speeding up of 3D fast spin echo imaging.

Figure 7:
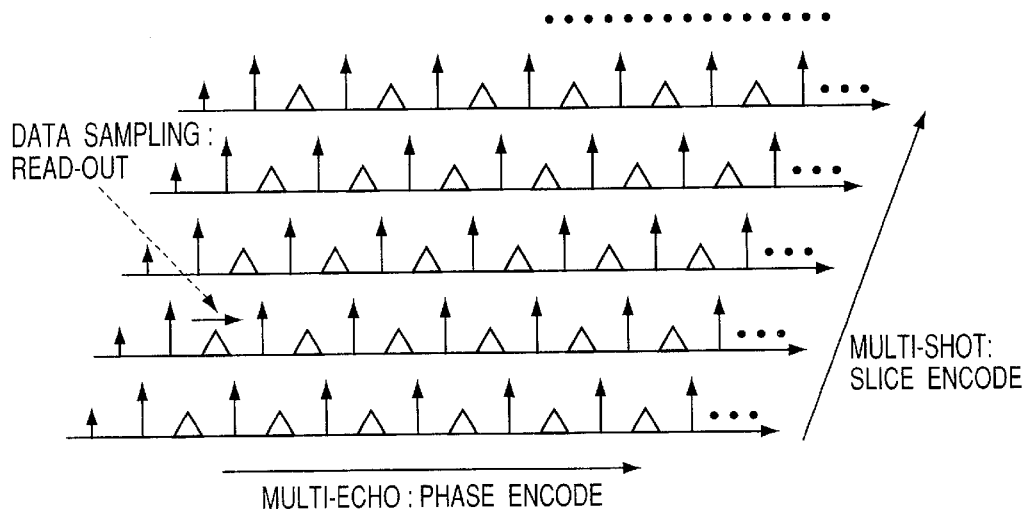
FIG. 7 shows a whole structure of pulse sequences for 3D fast spin echo imaging.

FIG. 7 shows the structure of a whole pulse sequence of 3D fast spin echo imaging. In this sequence, in one to several shots, multi-echo is detected while frequency encoding is being performed in a first direction (Read-Out) and phase encoding is being performed in a second direction (Phase Encode), whereby two-dimensional image data is acquired. In addition, shots (multi-shots) are repeated while slice encoding is performed in a third direction, whereby three-dimensional image data.

A half-Fourier method is known as an imaging method relating to reduction in amount of acquired data. The half-Fourier method is a data acquisition/reconstruction method. In the half-Fourier method, about half the data in the phase encoding direction and frequency encoding direction is acquired. Using the complex conjugate symmetry of K-space data, deficient data is supplemented and reconstruction is carried out. Thus, an image with less blur, which is close to an image obtained by using symmetric data (all data) in the k-space, can be obtained.

Figure 8A:
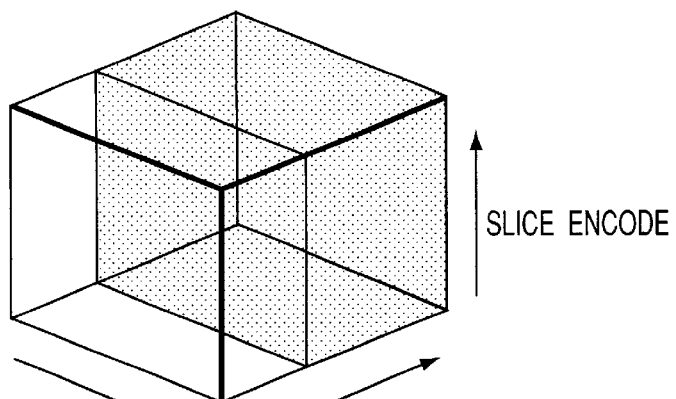
FIG. 8A shows a data acquisition region in prior art to which a half-Fourier method is applied.

In the prior art, in general, the half-Fourier method is applied in the phase encoding direction, as shown in FIG. 8A. In this prior art, too, there is a problem in that the time for acquiring 3D image data is very long.

Figure 8B:
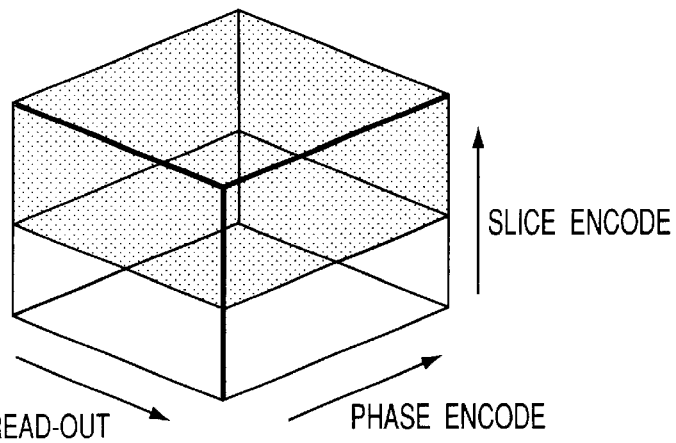
FIG. 8B shows a data acquisition region in a second embodiment of the invention to which a half-Fourier method is applied.

Under the circumstances, in the second embodiment of the present invention, all data is acquired in the phase encoding direction, unlike the prior art. The half-Fourier method is applied in the slice encoding direction, and data enough to perform reconstruction (about half data) is acquired. FIG. 8B illustrates this method. According to this second embodiment, the data acquisition time can be decreased, compared to the prior art.

Figure 8C:
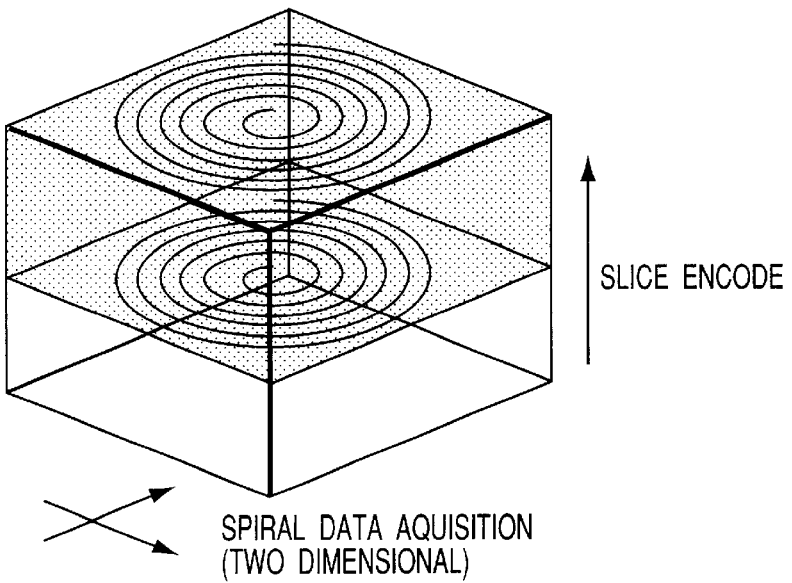
FIG. 8C shows spiral data acquisition in the second embodiment of the invention to which a half-Fourier method is applied.

It is preferable that a so-called spiral data acquisition method should be applied to data acquisition in a plane defined by the first and second directions. FIG. 8C illustrates the spiral data acquisition method.

Third Embodiment

A third embodiment of the present invention relates to a method of applying a gradient magnetic field in a case where the half-Fourier method described in the second embodiment is applied.

Figure 9A:
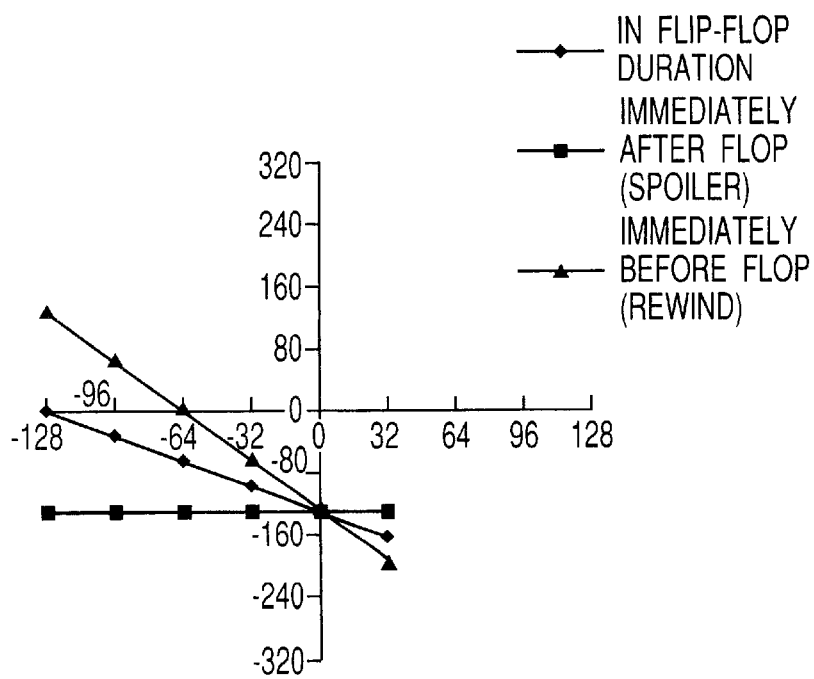
FIG. 9A is a graph showing application amounts of gradient magnetic fields in a flip-flop duration, immediately after the flop (spoiler) and immediately before the flop (rewind), according to a third embodiment of the invention, wherein a spoiling amount is equal to a maximum encoding amount.
Figure 9B:
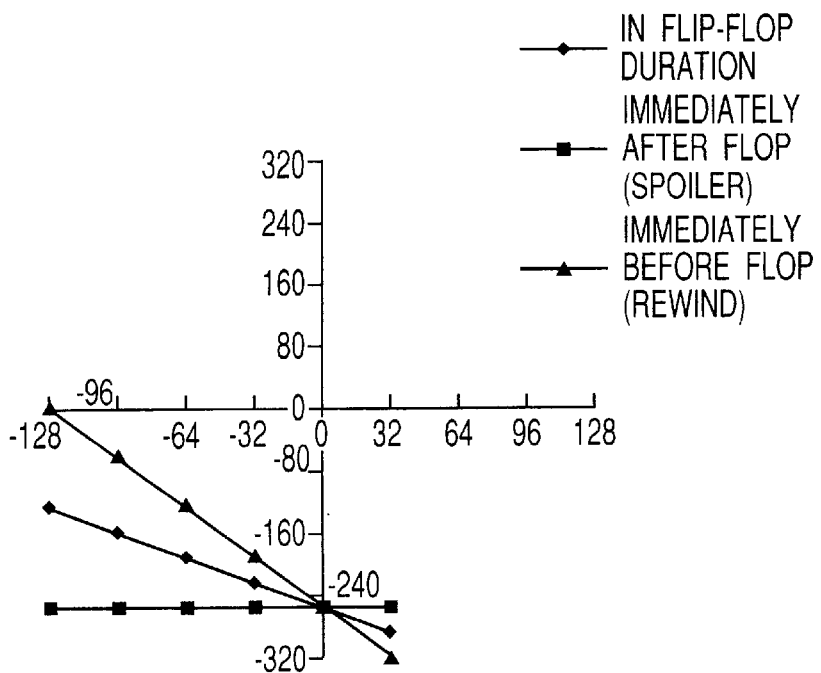
FIG. 9B is a graph showing application amounts of gradient magnetic fields in a flip-flop duration, immediately after the flop and immediately before the flop, according to the third embodiment of the invention, wherein the spoiling amount is increased to the "ideal" state.

FIGS. 9A and 9B relate to the third embodiment and are graphs showing application amounts of gradient magnetic fields in a flip-flop duration, immediately after the flop (spoiler) and immediately before the flop (rewind).

A pulse sequence of the third embodiment corresponds to the sequence Seq1 shown in FIG. 3. Since no data is acquired with respect to the encoding after phase encoding number k=32, no gradient magnetic filed is applied for the encoding. In short, the sequence Seq2 shown in FIG. 3 is not executed.

Following the data acquisition, the slice-directional half-Fourier reconstruction process is performed.

FIG. 9A shows a case where the spoiler amount is equal to the maximum encoding amount, and FIG. 9B shows a case where the spoiler amount is increased to the "ideal" state.

As is clear from FIGS. 9A and 9B, in the pulse sequence of the third embodiment, the positive/negative polarity of gradient magnetic field is not switched and the application amount is not increased needlessly. Accordingly, the technique of Modification 1 is applicable to various imaging conditions and absolute performances of apparatuses.

According to the above-described first to third embodiments, high-quality magnetic resonance images can be acquired in the fast sequence, for example, where it is not permitted to consume much time for applying gradient magnetic field.

Where imaging is performed with the same gradient magnetic field intensity, a higher spoiling effect can be obtained than in the prior art. This means that the gradient magnetic field intensity can be made lower than in the prior art, if the same spoiling effect is to be obtained.

Fourth Embodiment

In the first to third embodiments, immediately after the flop pulse is applied, the spoiler gradient magnetic field pulse is independently applied so as to prevent superimposition of other gradient magnetic field components, e.g. for phase encoding and rewind.

In the fourth embodiment, in addition to the conditions for pulse application as described in the first to third embodiments, the following condition is set. That is, the application amount of the spoiler gradient magnetic field pulse is determined according to a stricter condition so that a residual component of the FID signal caused by a certain RF pulse may not be refocused by a subsequent RF pulse.

In this embodiment, too, a description will be given of the fast multi-echo pulse sequence, specifically, the FSE sequence including the FASE method, and the 3D-FSE (or 3D-FASE) sequence. As has been mentioned above, in these sequences, it is necessary to spoil the FID signal occurring due to the RF pulse.

The following description is based on the assumption that the spoiler gradient magnetic field is applied in the slicing direction while the slice encoding is being performed, and that a predetermined amount of slice encoding is performed in one shot.

Gradient magnetic fields to be applied in the slice direction may be classified into three groups, if attention is paid to their functions:

(1) gradient magnetic field relating to slice selection,
(2) gradient magnetic field relating to spoiling of FID signal (slice spoiler), and
(3) gradient magnetic field relating to slice-directional phase encoding (slice encoder).

In the present embodiment, a simple model is treated wherein only the "amount" of the slice encoder and slice spoiler is considered.

Figure 10:
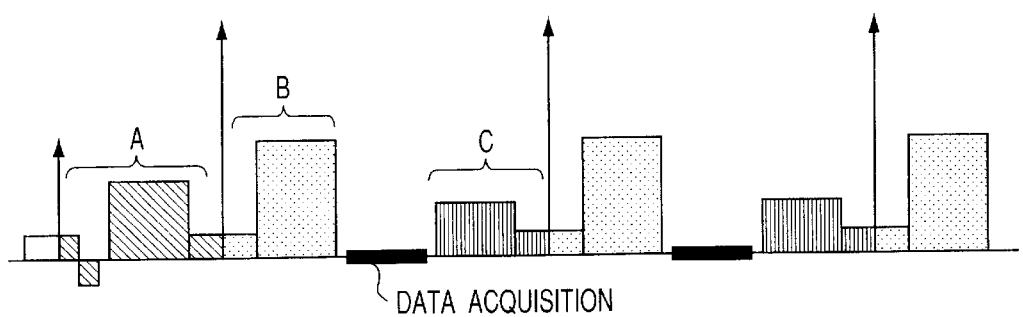
FIG. 10 is a view for explaining a basic condition of a slice gradient magnetic field according to a fourth embodiment of the invention.

As is shown in FIG. 10, in this model, the gradient magnetic field is divided into sections A to C. The section A indicates an area in the flip-flop duration. The section B indicates an area before read-out in the flop-flop duration. The section C indicates an area after read-out in the flop-flop duration.

Assume that in this model the maximum phase encoding amount is the unit of the area of the gradient magnetic field. Its physical unit is [Hz/cm·s]=[1/cm] and is given by 1/slice thickness. If the phase encoding amount is $\kappa$, $\kappa$ satisfies the formula, $-1 \leq \kappa \leq 1$.

In order to make just one rotation of spin within the slice thickness, it should suffice if a gradient magnetic field of 2 of the above unit is applied. If a gradient magnetic field of a greater application amount is applied, a necessary and sufficient spoiling effect is achieved.

Conditional expressions which the sections A to C in FIG. 10 should satisfy will now be explained in detail. The sections A to C are the amounts depending upon κ. Exactly speaking, the section A, for instance, should be expressed like Aκ or A(κ). However, to simplify the description, it is expressed as merely "A", unless otherwise noted.

To begin with, the basic condition of FSE is given by $$A:(B+C)=1:2 \quad (\#1)$$

The condition of the phase encoding amount is given by $B-A=\kappa$: phase encoding amount of first echo $B-(\kappa+C)=\kappa$: phase encoding amount of second (and following) echo (#2)

The latter equation of #2 is expressed by $$B-C=2\kappa \quad (\#3)$$

The requirements of spoiler are given by $|B| \geq 2$: spoil of FID component (#4)

$|C| \geq 2$: spoil of FID component subjected to flop (#5).

The formula (#4) is clear from the above explanation. If the FID receives the flop pulse, its inverted component has a dephased state expressed by B−(B+C). As a result, the inverted component is expressed by −C. Thus, the formula (#5) is derived.

As the once inverted component has a rephased state when the next RF pulse is applied, it is substantially same as FID component. In general, when the RF pulse is applied, only a dephased state expressed by an integer number of times of (B+C) appears. Thus, there is no need to consider other conditions than (#5).

As stated above, only the conditions (#1) to (#5) should be considered as the conditions of area of gradient magnetic field.

Where the conditions (#1) to (#5) are satisfied, a gradient magnetic field with an intensity corresponding four times the area of the maximum phase encoding amount needs to be applied irrespective of the kind of the gradient magnetic field application method.

This is derived from (#3) to (#5). Specifically, from the condition, $-1 \leq \kappa \leq 1$, B and C do not have different signs. Since κ can be ±1, the difference between B and C in this case is 2. Accordingly, either B or C has to be 4 or more.

An experimental result shows that artifact of FID signal is not completely eliminated if the condition (#4) alone is satisfied.

An actual example of the spoiler method based on the above conditions (#1) to (#5) will now be described.

[1] Sequence Based on Prior Art

A gradient magnetic field obtained by applying (#1) to (#5) to the sequence described as prior art is given by:

$A(\kappa)=3$ $B(\kappa)=3+\kappa$ $C(\kappa)=3-\kappa$

That is, the spoiler is applied with an amount of 3. If the amount is less than 3, a sufficient spoiler effect is not obtained.

Figure 11A:
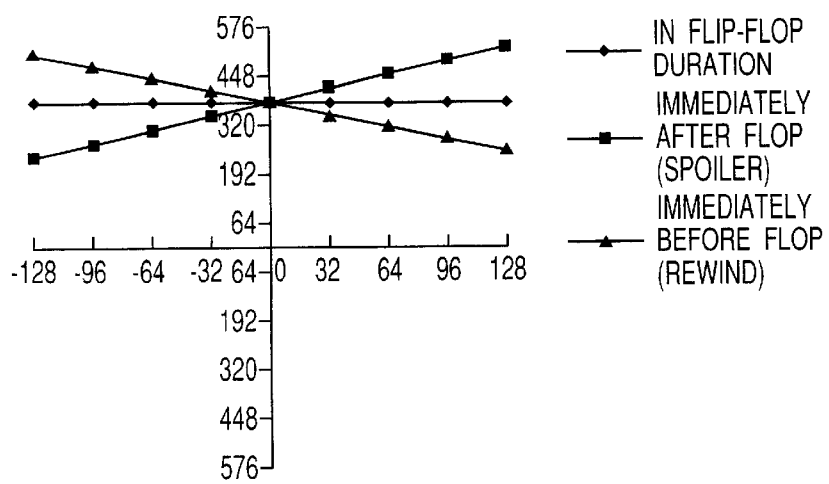
FIG. 11A is a graph showing application amounts of gradient magnetic fields in a flip-flop duration, immediately after the flop (spoiler) and immediately before the flop (rewind), according to a fourth embodiment of the invention, wherein a gradient magnetic field application method different from a CFS method and a VFS method is performed.
Figure 11B:
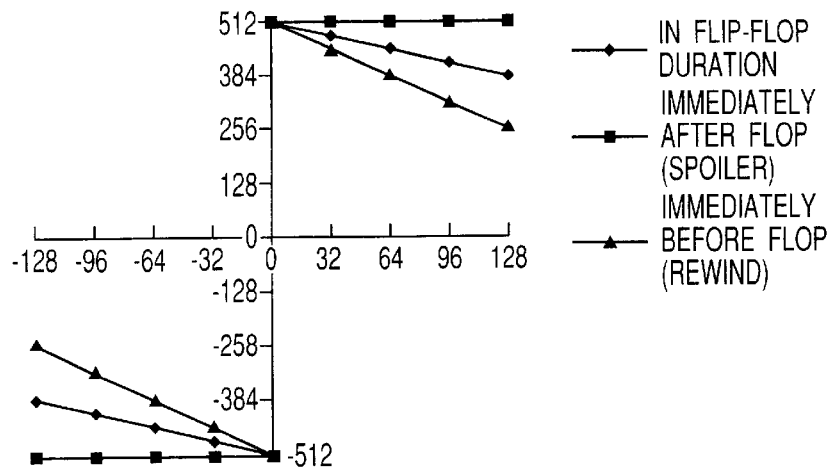
FIG. 11B is a graph showing application amounts of gradient magnetic fields in a flip-flop duration, immediately after the flop and immediately before the flop, according to the fourth embodiment of the invention, wherein the CFS method is performed.
Figure 11C:
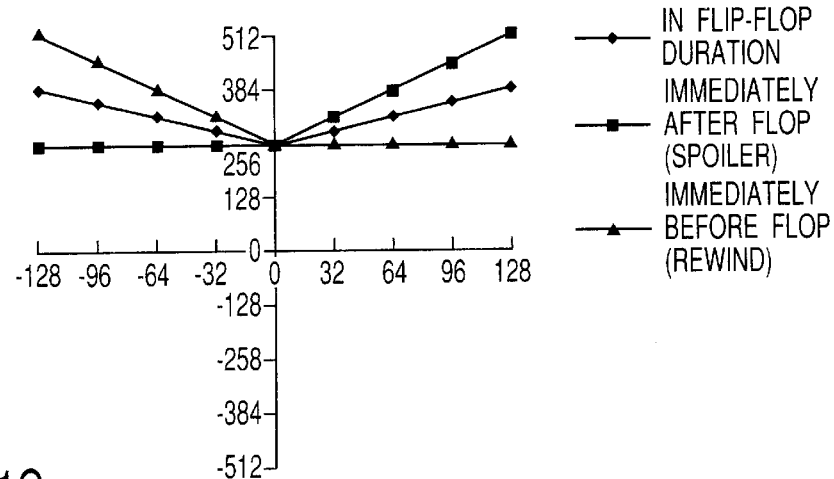
FIG. 11C is a graph showing application amounts of gradient magnetic fields in a flip-flop duration, immediately after the flop and immediately before the flop, according to the fourth embodiment of the invention, wherein the VFS method is performed.

FIG. 11A is a graph showing the application of the gradient magnetic field of this sequence. In this graph, 128 is regarded as corresponding to 1.

With respect to the maximum application amount, B or C is 4 at the time of κ±1.

[2] Constant Flop Spoiler (CFS) Method

As has been described above, in the CFS method, the spoiler immediately after the RF pulse is set at a constant value.

A gradient magnetic field obtained by applying (#1) to (#5) to the CFS method is given by the following.

Where $\kappa>0$, $A(\kappa)=4-\kappa$ $B(\kappa)=4$ $C(\kappa)=4-2\cdot\kappa$

Where $\kappa<0$, $A(\kappa)=-4-\kappa$ $B(\kappa)=-4$ $C(\kappa)=-4-2\cdot\kappa$ By changing the gradient magnetic field according to the positive/negative value of κ, the maximum area can be reduced to 4 or less.

According to experiments, it was found that the area of 4 or less could not be obtained by the CFS method. However, in the CFS method, the first FID is always spoiled by the gradient magnetic field with the area of 4 immediately after the RF pulse, as mentioned above. Thus, a remarkable spoiling effect is attained.

A subject such as a human being does not always have a uniform cross-sectional structure in the slicing direction. In view of this, a higher spoiling effect is obtained with the method [2] than with the method [1].

[3] Variable Flop Spoiler (VFS)

In the CFS method, a maximum spoiling effect of FID is obtained. However, with the CFS method, with respect to the FSE echo signal used for actual imaging, the phase shift of the moving spin by the gradient magnetic field moment of 1 order or more becomes large. It is thus estimated that extinction of signal or artifact of flow will increase due to dephasing. Where (#1) to (#5) are applied while the spoiling effect is being suppressed at the center of the k-space, the following is given:

$A(\kappa)=2+ABS(\kappa)$ $B(\kappa)=2+ABS(\kappa)+\kappa$ $C(\kappa)=2+ABS(\kappa)-\kappa$ The above-described method is referred to as a variable flop spoiler (VFS) method.

The VFS method is suitable for enhancing a blood flow description performance by a gradient magnetic field moment nulling wherein an effect of spoiling a read-out gradient magnetic field decreases.

As an example of a practical implement, the imaging mode (sequence) may be made switchable according to an object to be imaged. For example, an imaging mode of a constant flop spoiler (CFS) method may be switchably used for a still object (parenchyma, etc.) and similarly an imaging mode of a variable flop spoiler method may be switchably used for a moving object (blood flow, etc.).

Comparison between the present invention and the prior art will now be compared again from technical aspects. Generally speaking, in the present invention, the FSE, etc. is executed under the condition that the section A in FIG. 10 is not constant. In the prior art, the section A is kept constant. In the prior art, the phase encoding and the rewinding (opposite-directional) encoding are necessarily performed by sections B and C. Such prior art is well known as a basic method of FSE.

As has been described above, the present invention provides a magnetic resonance imaging apparatus wherein when an echo train spacing (ETS) is to be decreased for 3D imaging using the fast spin echo (FSE) method, no artifact occurs on an acquired image due to an unnecessary FID signal resulting from RF pulses, and a high-quality 3D image can be obtained.

The present invention is not limited to the above-described embodiments, and various modifications can be made. For example, this invention is applicable not only to the fast spin echo (FSE) sequence, but also to modified sequences thereof, e.g. a so-called GRASE method which is a combination of the FSE and an EPI (echo planner imaging) data acquisition method.

In a fast spin echo method wherein the interval of flop pulses is irregular, it is the basic condition to set the gradient magnetic field amount to confirm to the area which varies in proportion to each interval of flop pulses (DIET method: Dual Internal Echo Train method: Kanazawa H, et al., "Contrast Neutralization of Fast Spin Echo Imaging: A Fat Reduction Technique Free from Field Inhomogeneity", In proceeding, 2nd SMR, p. 486, 1994). The present invention is also applicable to this DIET method.

In a simplest practical example, the first and third flop pulses are deleted from the embodiments shown in FIGS. 1 and 3. Moreover, various modifications can be made with the condition for area is maintained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging apparatus comprising:
   an RF pulse application unit for applying an RF pulse to an imaging region;
   a gradient magnetic field application unit for applying a gradient magnetic field to the imaging region; and
   a control unit means for controlling the RF pulse application unit and the gradient magnetic field application unit according to a pulse sequence, said pulse sequence including:
   (a) applying an excitation RF pulse and a selection gradient magnetic field for selecting and exciting a spin within a desired region in a subject,
   (b) applying refocusing RF pulses for generating a plurality of echo signals by successively refocusing the excited spin several times,
   (c) applying a first phase encoding gradient magnetic field for providing a phase encoding of a different value to each of said plurality of echo signals, and
   (d) repeating said steps (a) to (c) while applying a second phase encoding gradient magnetic field with a varying value in a predetermined axis different from an axis of said first phase encoding gradient magnetic field, and
   said pulse sequence applying the second phase encoding gradient magnetic field immediately before each of the refocusing RF pulses, and applying a spoiler gradient magnetic field of a predetermined amount in the same axis as said predetermined axis between each of the refocusing RF pulses and each of the echo signals so that application of the spoiler gradient magnetic field is separated in time from application of the second phase encoding gradient magnetic field, and all the gradient magnetic fields applied in the same axis as said predetermined axis satisfying a phase condition of a CPMG method.

2. A magnetic resonance imaging apparatus according to claim 1, wherein the amount of the spoiler gradient magnetic field is constant.

3. A magnetic resonance imaging apparatus according to claim 1, wherein the amount of the spoiler gradient magnetic field varies in every repetition in said step (d).

4. A magnetic resonance imaging apparatus according to claim 1, wherein said predetermined axis of said second phase encoding gradient magnetic field is the same as a axis of application of the selection gradient magnetic field in said step (a).

5. A magnetic resonance imaging apparatus as in claim 1 wherein the area of gradient magnetic field pulses applied between the excitation RF pulse and the first refocusing RF pulse is substantially one-half the area of gradient magnetic field pulses applied between successive pairs of refocusing RF pulses.

6. A magnetic resonance imagine apparatus comprising:
   pulse application means for successively applying a plurality of exciting or refocusing RF pulses to an imaging region; and
   gradient magnetic field application means for applying a plurality of gradient magnetic fields such that all gradient magnetic fields applied in a predetermined axis satisfy a phase condition of a CPMG method and an application amount either immediately after the RF pulse application means has applied the refocusing RF pulses or immediately after a magnetic resonance signal has been read out becomes a predetermined amount or more;
   wherein said gradient magnetic fields includes at least a phase encoding component in a slicing axis and a spoiler component, and 3D imaging is executed based on a fast spin echo imaging sequence including:
   (a) applying an excitation RF pulse and a selection gradient magnetic field for selecting and exciting a spin within a desired region in a subject,
   (b) applying refocusing RF pulses for generating a plurality of echo signals by successively refocusing the excited spin several times,
   (c) applying a first phase encoding gradient magnetic field for providing a phase encoding of a different value to each of said plurality of echo signals, and
   (d) repeating said steps (a) to (c) while applying a second phase encoding gradient magnetic field with a varying value in a predetermined axis different from a axis of said first phase encoding gradient magnetic field, and
   said pulse sequence applying the second phase encoding gradient magnetic field immediately before each of the refocusing RF pulses, and applying a spoiler gradient magnetic field of a predetermined amount in said predetermined axis between each of the refocusing RF pulses and each of the refocusing RF pulses and each of the echo signals so that application of the spoiler gradient magnetic field is separated in time from application of the second phase encoding gradient magnetic field, and all the gradient magnetic fields applied in said predetermined axis satisfying a phase condition of a CPMG method.

7. A magnetic resonance imaging apparatus according to claim 6, wherein said gradient magnetic field application means executes a sequence for fluid imaging in which the spoiler component corresponding to a vicinity of a center of a k-space is reduced by a predetermined amount.

8. A magnetic resonance imaging apparatus according to claim 7, further comprising switching means for effecting switching between the sequence for the fluid imaging and a sequence for still object imaging in which the spoiler component corresponding to the vicinity of the center of the k-space is not reduced.

9. A magnetic resonance imaging apparatus according to claim 6, further comprising a GRASE type pulse sequence of a fast spin echo method in which a gradient magnetic field echo is also used.

10. A magnetic resonance imaging apparatus as in claim 6 wherein the area of gradient magnetic field pulses applied between the excitation RF pulse and the first refocusing RF pulse is substantially one-half the area of gradient magnetic field pulses applied between successive pairs of refocusing RF pulses.

11. A magnetic resonance imaging method comprising:

applying an RF pulse to an imaging region;

applying a gradient magnetic field to the imaging region; and controlling the RF pulse application unit and the gradient magnetic field application unit according to a pulse sequence, said pulse sequence, including:
(a) applying an excitation RF pulse and a selection gradient magnetic field which selects and excites a spin within a desired region in a subject,
(b) applying refocusing RF pulses to generate a plurality of echo signals by successively refocusing the excited spin plural times,
(c) applying a first phase encoding gradient magnetic field in a first axis to provide phase encoding of a different value to each of said plurality of echo signals, and
(d) repeating (a) to (c) while applying a second phase encoding gradient magnetic field with a varying magnitude in a predetermined axis different from the axis of said first phase encoding gradient magnetic field,
said second phase encoding gradient magnetic field being applied immediately before each of the refocusing RF pulses,
a spoiler gradient magnetic field of a predetermined magnitude being independently applied in the same axis as said predetermined axis at a different time than other gradient magnetic fields and at a time between the occurrences of each refocusing RF pulse and its respectively associated echo signal, and
all the gradient magnetic fields being applied in the same axis as said predetermined axis satisfying a CPMG method phase condition.

12. A magnetic resonance imaging method as in claim 11 wherein the magnitude of the spoiler gradient magnetic field is constant.

13. A magnetic resonance imaging method as in claim 11 wherein the magnitude of the spoiler gradient magnetic field varies in every repetition of (d).

14. A magnetic resonance imaging method as in claim 11 wherein said predetermined axis of said second phase encoding gradient magnetic field is the same as the axis of the selection gradient magnetic field used in (a).

15. A magnetic resonance imaging method comprising:

successively applying a plurality of exciting or refocusing RF pulses to an imaging region; and applying a plurality of gradient magnetic fields such that all gradient magnetic fields applied in a predetermined axis satisfy a CPMG method phase condition and are applied either immediately after a refocusing RE pulse has been applied or immediately after a read-out magnetic resonance signal becomes at least a predetermined magnitude;

wherein said gradient magnetic fields include at least a phase encoding component in a slicing axis and a spoiler component, and 3D imaging is executed based on a fast spin echo imaging sequence including:
(a) applying an excitation RF pulse and a selection gradient magnetic field which selects and excites a spin within a desired region in a subject,
(b) applying refocusing RF pulses to generate a plurality of echo signals by successively refocusing the excited spin plural times,
(c) applying a first phase encoding gradient magnetic field in a first axis to provide phase encoding of a different value to each of said plurality of echo signals, and
(d) repeating (a) to (c) while applying a second phase encoding gradient magnetic field with a varying magnitude in a predetermined axis different from the axis of said first phase encoding gradient magnetic field,
said second phase encoding gradient magnetic field being applied immediately before each of the refocusing RF pulses,
a spoiler gradient magnetic field of a predetermined magnitude being independently applied in the same axis as said predetermined axis at a different time than other gradient magnetic fields and at a time between the occurrences of each refocusing RF pulse and its respectively associated echo signal, and
all the gradient magnetic fields being applied in the same axis as said predetermined axis satisfying a CPMG method phase condition.

16. A magnetic resonance imaging method as in claim 15 wherein a sequence for fluid imaging is executed in which the spoiler component corresponding to a vicinity of a center of k-space is reduced by a predetermined amount.

17. A magnetic resonance imaging method as in claim 16 further comprising:

switching between the sequence for fluid imaging and a sequence for still object imaging in which the spoiler component corresponding to the vicinity of the center of k-space is not reduced.

18. A magnetic resonance imaging method as in claim 15 utilizing a GRASE type pulse sequence of a fast spin echo method in which a gradient magnetic field echo is also used.

* * * * *